(12) United States Patent
Takashima et al.

(10) Patent No.: US 7,733,683 B2
(45) Date of Patent: Jun. 8, 2010

(54) SEMICONDUCTOR MEMORY DEVICE

(75) Inventors: Daisaburo Takashima, Kanagawa-ken (JP); Ryu Ogiwara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 11/968,829

(22) Filed: Jan. 3, 2008

(65) Prior Publication Data

US 2008/0180984 A1    Jul. 31, 2008

(30) Foreign Application Priority Data

Jan. 15, 2007  (JP)  ............................. 2007-005795

(51) Int. Cl.
   *G11C 11/22* (2006.01)
(52) U.S. Cl. .............. 365/145; 365/230.03; 365/185.13
(58) Field of Classification Search ................. 365/145, 365/230.03, 185.13, 149, 185.22, 185.33, 365/104, 185.23, 185.26
   See application file for complete search history.

(56) References Cited

U.S. PATENT DOCUMENTS

| 5,903,492 | A  | * | 5/1999 | Takashima ................... 365/145 |
| 6,473,330 | B1 |   | 10/2002 | Ogiwara et al. |
| 2002/0122328 | A1 | * | 9/2002 | Oowaki et al. ............... 365/145 |
| 2002/0188893 | A1 | * | 12/2002 | Ogiwara et al. ................ 714/42 |
| 2003/0156489 | A1 | * | 8/2003 | Takeuchi et al. ............. 365/233 |

* cited by examiner

*Primary Examiner*—Dang T Nguyen
(74) *Attorney, Agent, or Firm*—Oblon, Spivak, McClelland, Maier & Neustadt, L.L.P.

(57) ABSTRACT

Disclosed is a semiconductor memory including ferroelectric capacitors. Memory cells each including a ferroelectric capacitor and an insulted-gate-type cell transistor are connected to a corresponding one of bit lines. Insulated-gate-type separating transistors are connected between multiple bit-line selecting transistors and multiple sense amplifiers, respectively. When the separating transistors are turned on, data retained in the sense amplifiers are capable of being written to the memory cells during the same time period substantially.

14 Claims, 10 Drawing Sheets

SEMICONDUCTOR MEMORY DEVICE

CROSS REFERENCE TO RELATED APPLICATION

This application is based upon and claims the benefit of priority from the prior Japanese Patent Application No. 2007-5795, filed on Jan. 15, 2007, the entire contents of which are incorporated herein by reference.

FIELD OF THE INVENTION

The present invention relates to a semiconductor memory device including ferroelectric capacitors.

DESCRIPTION OF THE BACKGROUND

FeRAM (Ferroelectric Random Access Memory), MRAM (Magnetic Random Access Memory), PRAM (Phase Change Random Access Memory) and RRAM (Resistive Random Access Memory) have been developed as next-generation semiconductor memory devices.

FeRAM is disclosed, for example, in Japanese Patent Application Laid-open Publication No. 2000-339973. This type of FeRAM is composed of multiple memory cells arranged in a matrix, and each of the memory cells includes a ferroelectric capacitor and an insulated-gate-type cell transistor. Data are written to, and read from, the ferroelectric capacitors through corresponding bit and word lines respectively which are connected to the insulated-gate-type cell transistors.

Such a type of semiconductor memory device performs a write operation which will be described with reference to FIG. 4 hereafter.

As shown in FIG. 4, voltages of the respective column selecting lines CSL0, CSL1, . . . , CSLn−1 are sequentially raised from a "Low" level to a "High" level. In response, voltages of the respective bit lines /BL0, BL0, /BL1, BL1, . . . , /BLn−1, BLn−1 are raised or dropped. The raised and dropped voltages of the bit lines continue to be written to the memory cells connected to the bit line as data.

As shown in FIG. 5, a ferroelectric film to be used for a ferroelectric capacitor gradually increases its polarization amount over a polarization inversion time. When the polarization inversion time becomes, for example, equal to or longer than approximately 1000 ns, the polarization amount becomes saturated. This polarization property depends on temperature T° C. For this reason, when the ambient temperature around the ferroelectric capacitor becomes higher, the polarization amount accordingly increases. As a result, the polarization amount is smaller in a memory cell when the write time is shorter for the memory cell, while the polarization amount is larger in a memory cell when the write time is longer for the memory cell.

Such a type of memory cell is usually tested in terms of its data retention capability and imprint capability. During these tests, it is likely that a defect-free memory cell may be judged as a defective one because the polarization amount is insufficient, when the time period to write data to the memory cell is too short. In addition, it is likely that a defective memory cell may be judged as a defect-free one because the polarization amount is sufficient, when the time period to write data to the memory cell is too long.

These facts may make it difficult to test the semiconductor memory device accurately in terms of its data retention capability and imprint capability. As a result, it is likely that semiconductor memories each including less reliable memory cells may be shipped out. If a more rigid screening test is applied to semiconductor memory devices, the yield of the semiconductor memory devices may be reduced.

SUMMARY OF THE INVENTION

An aspect of the present invention provides a semiconductor memory device comprising at least one plate line, bit lines, each of the bit lines having a first portion and a second portion, memory cells, each of the memory cells being connected between each one of the first portions of the bit lines and the at least one plate line, each of the memory cells including a ferroelectric capacitor and a cell transistor, word lines, each of the word lines being connected to each plurality of the gates of the cell transistors, sense amplifiers to amplify and hold data, each of the sense amplifiers being connected to at least one of the second portions of the bit lines, bit-line selecting transistors, each of the bit-line selecting transistors being connected between each one of the memory cells and each one of the first portions of the bit lines, and separating transistors, each of the separating transistors having a source, a drain and a gate, one of the source and the drain being connected to one of the first portions of the bit lines, the other of the source and the drain being connected to one of the bit-line selecting transistors, and the gate being connected to a separation control line to provide a separation control signal, wherein by providing the separation control line with the separation control signal, the separating transistors are turned on so that data held in the sense amplifiers are written to the memory cells during the same time period substantially.

Another aspect of the present invention provides a semiconductor memory device comprising at least one plate line, bit lines, each of the bit lines having a first portion and a second portion, memory cells, each of the memory cells being connected between each one of the first portions of the bit lines and the at least one plate line, each memory cell including a ferroelectric capacitor and a cell transistor, word lines, each of the word lines being connected to each plurality of the gates of the cell transistors, sense amplifiers to amplify and hold data, each of the sense amplifiers being connected to at least one of the second portions of the bit lines, and separating transistors, each of the separating transistors having a source, a drain and a gate, one of the source and the drain being connected to one of the first portions of the bit lines, the other of the source and the drain being connected to one of the memory cells, and the gate being connected to a separation control line to provide a separation control signal, wherein by providing the separation control line with the separation control signal, the separating transistors are turned on so that data held in the sense amplifiers are written to the memory cells during the same time period substantially

DETAILED DESCRIPTION OF THE INVENTION

Embodiments of the present invention will be described hereinafter with reference to the drawings.

Figure 1:
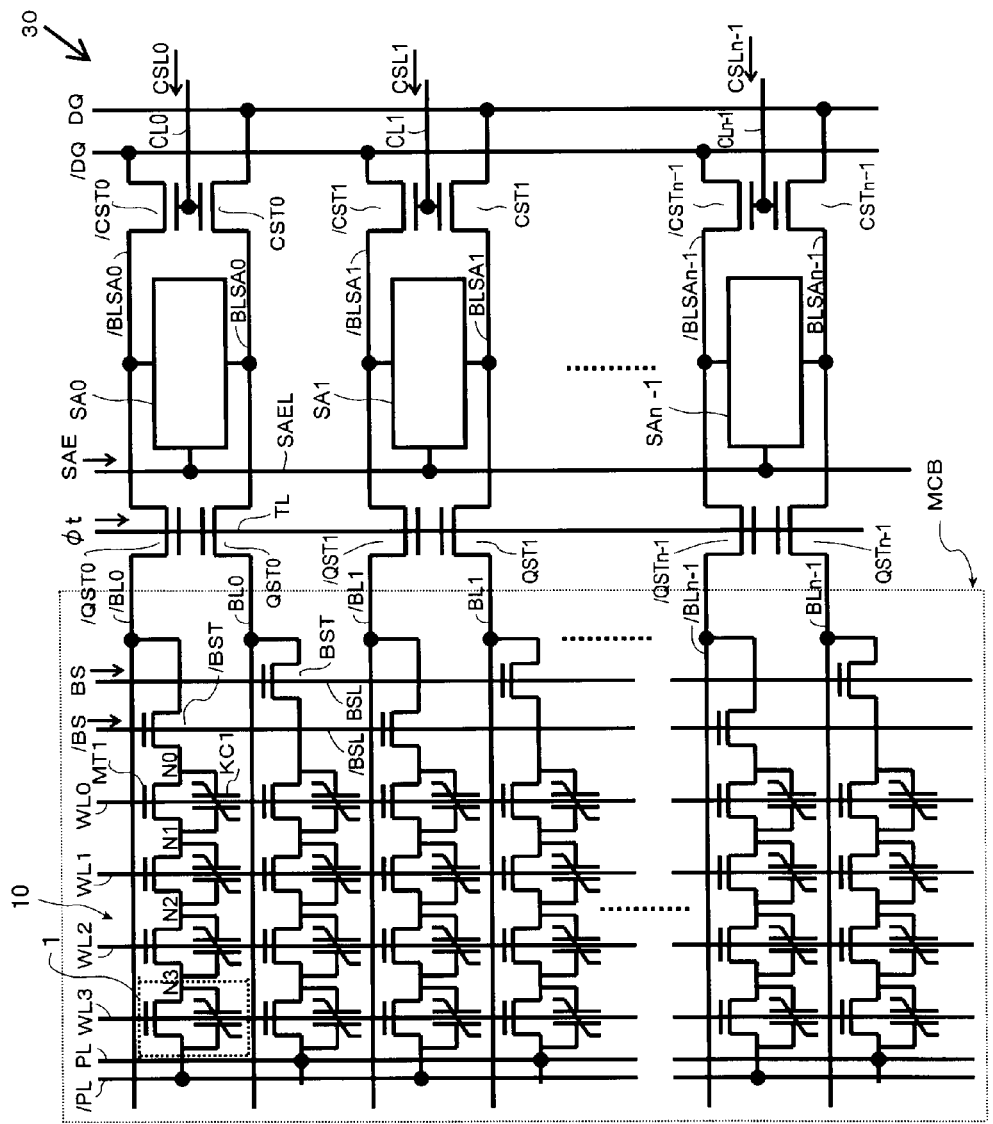
FIG. 1 is a circuit diagram showing a semiconductor memory device according to a first embodiment of the present invention.
Figure 2A:
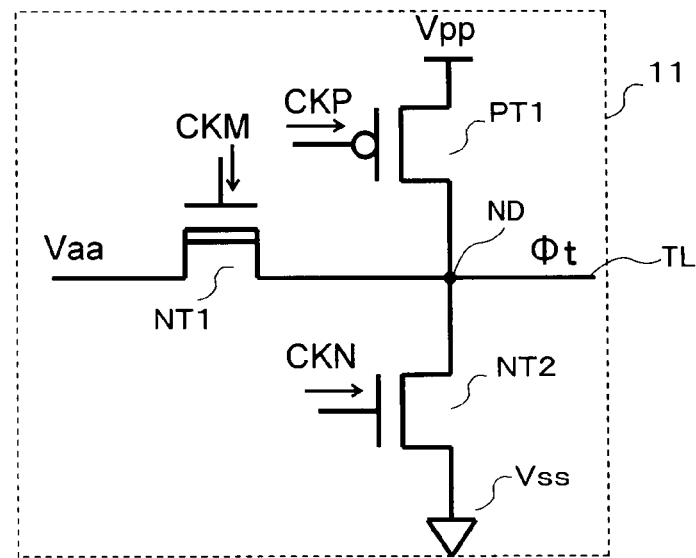
FIG. 2A is a circuit diagram showing a separation-control-signal generating circuit in the semiconductor memory device according to the first embodiment of the present invention.
Figure 2B:
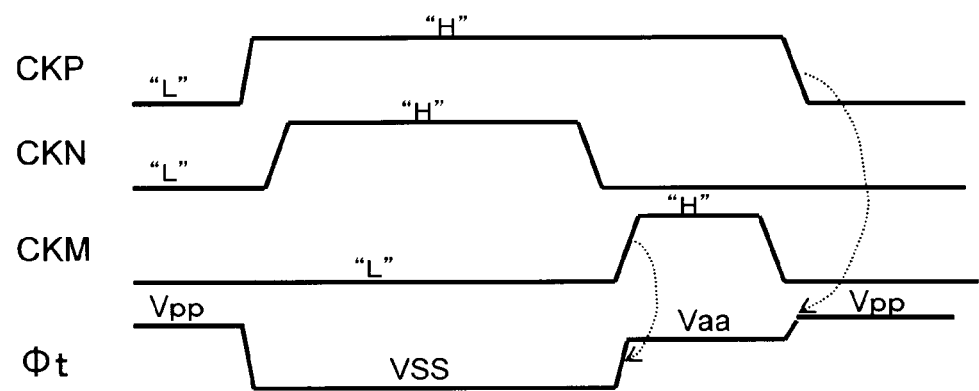
FIG. 2B is a timing chart showing an operation of the separation-control-signal generating circuit of the semiconductor memory device according to the first embodiment of the present invention.
Figure 3:
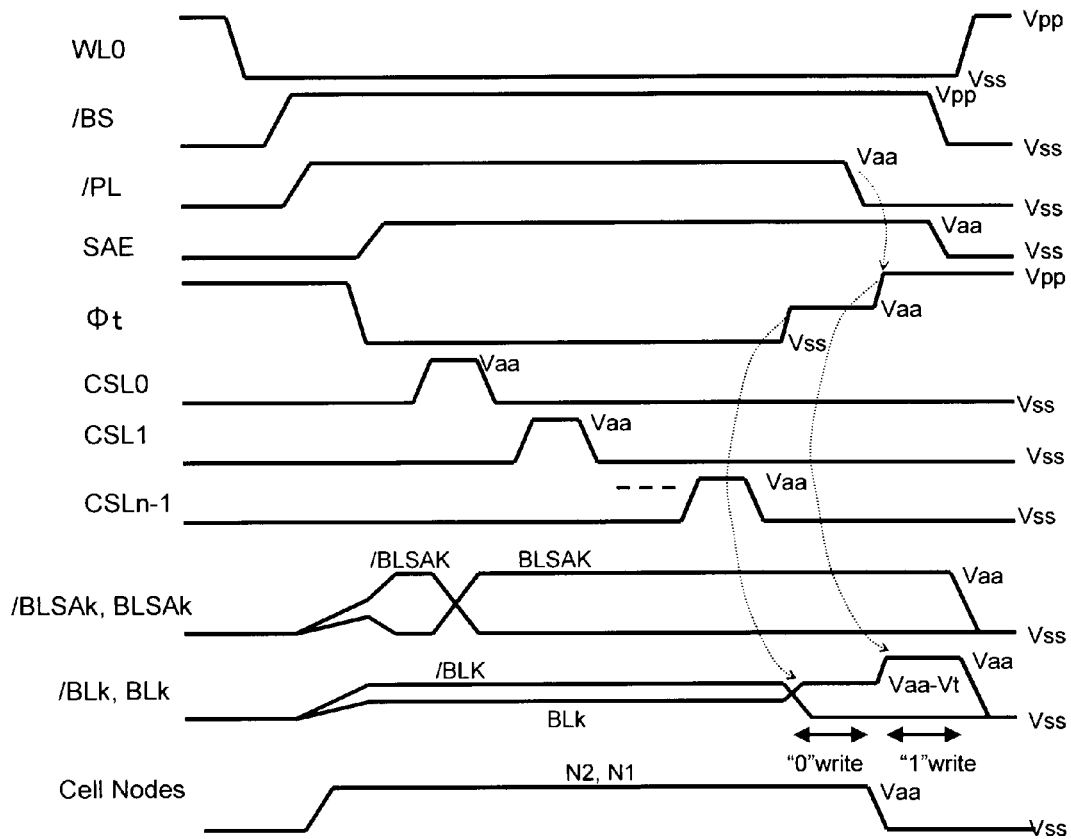
FIG. 3 is a timing chart showing a write operation of the semiconductor memory device according to the first embodiment of the present invention.
Figure 4:
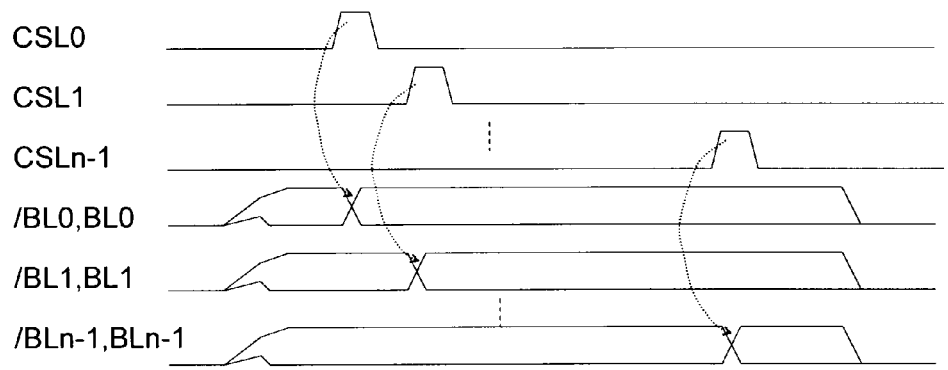
FIG. 4 is a timing chart showing a write operation of a conventional type of semiconductor memory device.
Figure 5:
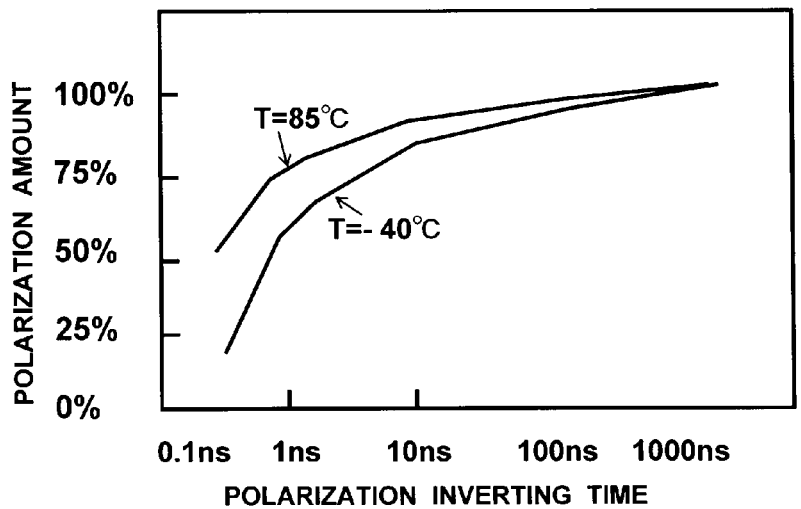
FIG. 5 is a diagram showing a relationship between a polarization inversion time and a polarization amount.

A semiconductor memory device according to a first embodiment of the invention will be described with reference to FIGS. 1, 2A, 2B and 3. FIG. 1 is a circuit diagram showing the semiconductor memory device according to the first embodiment of the present invention. FIG. 2A is a circuit diagram showing a separation-control-signal generating circuit in the semiconductor memory device shown in FIG. 1. FIG. 2B is a timing chart showing an operation of the separation-control-signal generating circuit shown in FIG. 2A. FIG. 3 is a timing chart showing a write operation of the semiconductor memory device according to the first embodiment of the present invention.

In the embodiment, separating transistors are connected between sense amplifiers and bit-line selecting transistors. Writing time period to write data to memory cells is controlled in order that the writing time period is equal to each other substantially, by supplying a sense-amplifier activating signal SAE to the sense amplifiers, and by a separation control signal to the separating transistors.

As shown in FIG. 1, a semiconductor memory device 30 (e.g. a chain FeRAM) includes a memory cell block MCB; sense amplifiers SA0, SA1, . . . , SAn−1 to amplify and to hold data, separation transistors /QST0, /QST1, . . . , /QSTn−1 and QST0, QST1, . . . , QSTn−1, and column selecting transistors /CST0, /CST1, . . . , /CSTn−1 and CST0, CST1, . . . , CSTn−1.

In the memory cell block MCB, memory cells 1, . . . , 1 are connected to one another in series between each of bit lines BL0, BL1, . . . , BLn−1 and /BL0, /BL1, . . . , /BLn−1, i.e. first portions of respective bit lines, and a corresponding one of plate lines PL and /PL as source lines. In FIG. 1, four memory cells 1, . . . ,1 are connected to one another in series in each row. The memory cells 1, . . . , 1 include ferroelectric capacitors KC1, . . . , KC1 and cell transistors MT1, MT1, respectively. Ferroelectric capacitors KC1, . . . , KC1 and cell transistors MT1, . . . , MT1 are connected in parallel between each of the bit lines and a corresponding one of the plate lines.

These memory cells 1, . . . , 1 constitute a memory cell array 10. Bit lines /BLSA0, BLSA0, /BSAS1, BLSA1, . . . , /BLSAn−1, BLSAn−1, i.e. second portions of the respective bit lines arranged in a sense amplifier section are connected respectively to pairs of the input and output terminals of the sense amplifier SA0, SA1 . . . , SAn−1.

Four memory cells 1, . . . , 1 and a bit-line selecting transistor /BST are connected to one another in series between the bit line /BL0 and the plate line /PL. Four memory cells 1, . . . , 1 and a bit-line selecting transistor BST are connected to one another in series between the bit line BL0 and the plate line PL. Between any other bit line and its corresponding one of the plate lines /PL and PL, similarly, four memory cells 1, . . . , 1 and a bit-line selecting transistor are connected to one another in series.

PZT (lead zirconate titanate; $PbZrTiO_3$), which is a provskite-type oxide, is used for the ferroelectric film of each of the ferroelectric capacitors KC1, . . . , KC1. Instead, another provskite-type oxide such as SBT (strontium bismuth tantalate; $SrBi_2Ta_2O_9$) or BLT (bismuth lanthanum titanate; $(Bi, La)_4Ti_3O_{12}$), an organic polymer or the like may be used for the ferroelectric film.

One of the source and drain of the bit-line selecting transistor /BST is connected to the bit line /BL0. The other of the source and drain of the bit-line selecting transistor /BST is connected to a node N0 at one side of a memory cell 1 rightmost in FIG. 1. A bit-line selecting signal /BS is inputted to the gate of the bit-line selecting transistor /BST from a bit-line selecting line /BSL.

One of the source and drain of the bit-line selecting transistor BST is connected to the bit line BL0. The other of the source and drain of the bit-line selecting transistor BST is connected to a node N0 at one side of a memory cell 1 rightmost in the corresponding row in FIG. 1. A bit-line selecting signal BS is inputted to the gate of the bit-line selecting transistor BST from a bit-line selecting line BSL.

In any other rows, the bit-line selecting transistors have the same configuration as the above.

In FIG. 1, the gates of the cell transistors in the memory cells, which are arranged in the most right position from the bit-line selecting transistors BST, /BST, . . . , BST, /BST are connected to a word line WL0. The gates of the cell transistors in the memory cells, which are arranged in the second position from the bit-line selecting transistors BST, /BST, . . . , BST, /BST, are connected to a word line WL1. The gates of the cell transistors in the memory cells, which are arranged in the third position from the bit-line selecting transistors BST, /BST, . . . , BST, /BST are connected to a word line WL2. The gates of the cell transistors in the memory cells, which are arranged in the fourth position from the bit-line selecting transistors BST, /BST, . . . , BST, /BST are connected to a word line WL3.

In FIG. 1, one of the source and drain of each of the cell transistors, which are arranged in the first position from the right between the bit-line selecting transistor /BST and the plate line /PL in the most upper row, is connected to the other (node N0) of the source and drain of the bit-line selecting transistor /BST. The other of the source and drain of each of the cell transistors, which are arranged in the second position from the right, is connected to a node N1. One of the source and drain of each of the cell transistors, which are arranged in the second position from the right, is connected to the node N1.

The other of the source and drain of each of the cell transistors, which are arranged in the second position from the right, is connected to a node N2.

One of the source and drain of each of the cell transistors, which are arranged in the third position from the right, is connected to the node N2. The other of the source and drain of each of the cell transistors, which are arranged in the third position from the right, is connected to a node N3. The other of the source and drain of each of the cell transistors, which are arranged in the fourth position from the right, is connected to the plate line /PL.

The bit-line selecting transistors and the cell transistors arranged in any other rows are similarly connected.

The semiconductor memory 30 is provided with separating transistors /QST0, QST0, . . . , /QSTn−1, QSTn−1.

One of the source and drain of the separating transistor /QST0 is connected to the bit line /BLSA0 arranged in the sense amplifier section. The other of the source and drain of the separating transistor /QST0 is connected to the bit line /BL0. A separation control signal Φt is inputted to the gate of the separating transistor /QST0 from a separation control line TL. When the separation control signal Φt is at the "High" level, the separating transistor /QST0 separates the sense amplifier SA0 from the four memory cells 1, . . . , 1 connected to the bit line /BL0.

One of the source and drain of the separating transistor QST0 is connected to the bit line BLSA0 in the sense amplifier section. The other of the source and drain of the separating transistor QST0 is connected to the bit line BL0. The separation control signal Φt is inputted to the gate of the separating transistor QST0 from the separation control line TL. When the separation control signal Φt is at the "Low" level, the separating transistor QST0 separates the sense amplifier SA0 from the four memory cells 1, . . . , 1 connected to the bit line BL0.

In any other rows, each pair of the separating transistors is similarly connected to each pair of the bit lines arranged in the sense amplifier section, to each pair of the bit lines arranged in the memory cell block MCB, and to the separation control line, respectively.

One of the paired input and output terminals of the sense amplifier SA0 is connected to the bit line /BLSA0 arranged in the sense amplifier section. The other of the paired input and output terminals of the sense amplifier SA0 is connected to the bit line BLSA0 arranged in the sense amplifier section. The sense amplifier SA0 is controlled by a sense-amplifier activating signal SAE from an interconnection SAEL. One of the paired input and output terminals of the sense amplifier SA1 is connected to the bit line /BLSA1 arranged in the sense amplifier section. The other of the paired input and output terminals of the sense amplifier SA1 is connected to the bit line BLSA1 arranged in the sense amplifier section. The sense amplifier SA1 is controlled by the sense-amplifier activating signal SAE from the interconnection SAEL.

Each of the other sense amplifiers SA2, . . . , SAn−1 is similarly connected to its corresponding two bit lines in the sense amplifier section and the interconnection SAEL, and is controlled by the sense-amplifier activating signal SAE.

Column selecting transistors /CST0, CST0, . . . , /CSTn−1, CSTn−1 are connected to the sense amplifiers SA0, . . . , SAn−1 through the corresponding bit lines /BLSA0, BLSA0, . . . , /BLSAn−1, BLSAn−1.

One of the source and drain of the column selecting transistor /CST0 is connected to a data line /DQ. The other of the source and drain of the column selecting transistor /CST0 is connected to the bit line /BLSA0 arranged in the sense amplifier section. The gate of the column selecting transistor /CST0 is connected to a column selecting line CL0. A column selecting signal CSL0 is inputted to the gate of the column selecting transistor /CST0 from the column selecting line CL0.

One of the source and drain of the column selecting transistor CST0 is connected to a data line DQ. The other of the source and drain of the column selecting transistor CST0 is connected to the bit line BLSA0 in the sense amplifier section. The gate of the column selecting transistor CST0 is connected to a column selecting line CL0. A column selecting signal CSL0 is inputted to the gate of the column selecting transistor CST0 from the column selecting line CL0.

Any other column selecting transistors are similarly connected to the data lines, to the bit lines arranged in the sense amplifier section, and to the column selecting lines.

A separation-control-signal generating circuit 11 (shown in FIG. 2A) for generating the separation control signal Φt is connected to the separation control line TL connected to the gates of the respective separating transistors QST0, . . . , QSTn−1 and /QST0, . . . , /QSTn−1.

As shown in FIG. 2A, the separation-control-signal generating circuit 11 is composed of a first n-channel insulated-gate-type field effect transistor NT1, a second n-channel insulated-gate-type field effect transistor NT2 and a p-channel insulated-gate-type field effect transistor PT1. The separation control signal Φt outputted from the output terminal (node ND) has three signal levels. These signal levels are a high-potential supply voltage Vpp, a low-potential supply voltage (ground potential) Vss, and an intermediate voltage Vaa. The relationship among the three voltages are expressed by $$Vpp>Vaa>Vss \qquad (1)$$

The transistor NT1 is an insulated-gate-type field effect transistor of an n-channel depression type (normally-on type). The voltage Vaa is applied to the drain (first terminal) of the transistor NT1. The node ND working as the output terminal is connected to the source (second terminal) of the transistor NT1. A control signal CKM is inputted to the gate of the transistor NT1. A transfer gate composed of an n-channel insulated-gate-type field effect transistor and a p-channel insulated-gate-type field effect transistor may be used instead of the transistor NT1. In this case, it is desirable that the control signal CKM should be inputted to the p-channel insulated-gate-type field effect transistor after the phase of the control signal CKM is inverted by an inverter. Otherwise, a switch may be used instead of the transistor NT1.

The source (second terminal) of the transistor PT1 is connected to the high-potential supply voltage Vpp. The drain (first terminal) of the transistor PT1 is connected to the node ND. A control signal CKP is inputted to the gate (control terminal) of the transistor PT1.

The drain (first terminal) of the transistor NT2 is connected to the node ND. The source (second terminal) of the transistor NT2 is connected to the low-potential supply voltage (ground potential) Vss. A control signal CKN is inputted to the gate (control terminal) of the transistor NT2. Thereby, the separation control signal Φt is outputted from the node ND.

The separation-control-signal generating circuit 11 and the multiple separating transistors /QST0, QST0, . . . function as separation control means for separating the memory cell arrays 10 respectively from the sense amplifiers SA0, SA1, . . . , SAn−1.

As shown in FIG. 2B, when the voltages of the respective control signals CKP, CKN and CKM are all at the "Low" level in the separation-control-signal generating circuit 11, the transistor PT1 turns "ON," and the transistors NT1 and NT2 turn "OFF." As a result, the voltage of the separation control signal Φt rises to the "Vpp" level (the high-potential supply voltage Vpp).

When the voltages of the respective control signals CKP and CKN change from the "Low" level to the "High" level with the voltage of the control signal CKM remaining at the "Low" level, the transistor NT2 turns "ON," and the transistor PT1 turns "OFF." As a result, the voltage of the separation control signal Φt drops to the "Vss" (ground potential, which is the low-potential supply voltage).

When the voltage of the control signal CKP remains at the "High" level with the voltage of the control signal CKN changing from the "high" level to the "Low" level and with the voltage of the control signal CKM changing from the "Low" level to the "High" level, the transistor PT1 remains "OFF," and the transistor NT2 turns "OFF." As a result, the voltage of the separation control signal Φt rises to the "Vaa" level (the intermediate voltage Vaa).

An operation of the semiconductor memory 30 shown in FIG. 1 will be described with reference to FIG. 3. FIG. 3 is a timing chart showing the operation of the semiconductor memory 30 operates.

In the semiconductor memory 30, as shown in FIG. 3, for example, when the word line WL0 is selected, the voltage of the word line WL0 is changed from the "High" level ("Vpp" level) to the "Low" level ("Vss" level). The voltage of the bit-line selecting signal /BS is changed from the "Low" level ("Vss" level) to the "High" level ("Vpp" level). Subsequently, the voltage of the plate line /PL is changed from the "Low" level ("Vss" level) as a first voltage level to the "High" level ("Vaa" level) as a second voltage level. As a result of these voltage changes, data is sequentially read out from the memory cells 1, . . . , 1 to the respective bit lines /BL0, /BL1, . . . , /BLn−1.

The data read out are transmitted to the bit lines /BLSA0, /BLSA1, . . . , /BLSAn−1 arranged in the sense amplifier section. Thereafter, the voltage of the separation control signal Φt, which is inputted to the gates of the separation transistors /QST0, . . . respectively for separating the memory cell arrays from the sense amplifiers, is dropped from the "High" level ("Vpp" level) as a third voltage level to the "Low" level ("Vss" level) as a fourth level. By the operation, the memory cell arrays 10 are electrically separated from the respective sense amplifiers SA0, SA1, . . . , SAn−1.

Subsequently, the voltage of the sense-amplifier activating signal SAE is raised from the "Low" level ("Vss" level) to the "High" level ("Vaa" level). By the rise of the voltage, the voltages respectively of the paired bit lines /BLSAk and BLSAk connected to each of the sense amplifiers SA0, SA1, . . . , SAn−1 in the sense amplifier section are amplified, where k denotes integers ranging from 1 to (n−1).

Thereafter, the voltages of the respective column selecting signals CSL0, CSL1, . . . , CSLn−1 are sequentially raised from the "Low" level ("Vss" level) to the "High" level ("Vaa" level). Thereby, out of two voltages (two pieces of data) to be retained in each of the bit lines /BLSA0, /BLSA1, . . . , /BLSAn−1 in the sense amplifier section, data "0 (zero)" is transferred to, and is thus read in, the data lines DQ, /DQ.

At this time, in a case where write data is supplied through the data lines DQ, /DQ from the outside, the write data is written to the bit lines /BLSA0, /BLSA1, . . . , /BLSAn−1 arranged in the sense amplifier section. The data written to each of the bit lines in the sense amplifier section is amplified and held in each corresponding one of the sense amplifiers SA0, . . . , SAn−1. At this moment, the data retained in each of the sense amplifiers SA0, . . . , SAn−1 is not written to any memory cells 1, . . . , 1.

Subsequently, the voltage of the separation control signal Φt is raised from the "Low" level as the fourth voltage level to the "Vaa" level as a fifth voltage level which is lower than the "Vpp" level. As a result, the data "0 (zero)" is written to all of the memory cells to which the data "0 (zero)" should be written out of the memory cells 1, . . . , 1 connected to the selected word line WL0 during the same time period substantially.

In this respect, because the signal level of the separation control signal Φt is at the "Vaa" level as the fifth voltage level, a voltage (Vaa-Vt) is applied to the bit lines /BL0, /BL1, . . . , /BLn−1, and BL0, BL1, . . . , BLn−1, where Vt denotes the threshold voltage of the transistors.

At this time, the voltage of each of the nodes N2, which is positioned near the non-selected word line WL1 arranged adjacent to the selected word line WL0, is the "Vaa" level of the voltage of the plate line /PL. The voltage of the bit line /BL0 is raised by the voltage (Vaa-Vt). Furthermore, the memory transistors connected to the selected word line WL0 are in the "ON" state. For this reason, the voltage of each of the nodes N1 is at the "Vaa" level. As a result, this may make it possible to avoid a problem of disturbances to the adjacent memory cells.

Thereafter, the voltage of the line /PL is changed from the "High" level ("Vaa" level) as the second voltage level to the "Low" level ("Vss" level) as the first voltage level. Subsequently, the voltage of the separation control signal Φt is raised the "Vaa" level as the fifth voltage level to the "High" level ("Vpp") level as the third voltage level. As a result, in a case where the write data is "1," the voltage at the "Vaa" level is transferred from each of the bit lines /BLSA0, /BLSA1, . . . , /BLSAn−1 in the sense amplifier section to each of the bit lines /BL0, /BL1, . . . , /BLn−1 and BL0, BL1, BLn−1. Thereby, the data "1" is written to all of the memory cells to which the data "1" should be written in almost the same lengths of time.

As described above, after the plate voltage of the plate line /PL is dropped from the "High" level ("Vaa" level) as the second voltage level to the "Low" level ("Vss" level) as the first voltage level, the voltage of each of the bit lines /BLk is raised.

For this reason, the cell transistors in the respective memory cells connected to the non-selected word line WL1 adjacent to the selected word line WL0 do not turn to the "OFF" state. As a result, this may make it possible to avoid a problem of disturbances to the adjacent memory cells.

In a case of a semiconductor memory device, which is designed without such a separation control means having the separation-control-signal generating circuit 11 and the separation transistors /QST0, . . . , /QSTn−1, data are continued to write to the memory cells 1, . . . , 1, once the data are sequentially started to write to the memory cells 1, . . . , 1. As a result, the time periods to write the data are different among the memory cells.

In contrast, in the case of the semiconductor memory according to the embodiment, the separation control signal Φt outputted from the separation-control-signal generating circuit 11 outputs one of the low-potential supply voltage (ground potential) Vss, the intermediate voltage Vaa and the high-potential supply voltage Vpp. The separation control signal Φt is inputted to the gates of the respective separating transistors QST0, QST1, . . . , QSTn−1 and /QST0, /QST1, . . . , /QSTn−1. These separating transistors and the separation-control-signal generating circuit 11 electrically separate the memory cells the bit lines BL0, BL1, . . . , BLn−1 and /BL0, /BL1, . . . , /BLn−1 connected to the memory cells 1, . . . , 1 from the bit lines /BLSA0, /BLSA1, . . . , /BLSAn−1 and BLSA0, BLSA1, . . . , BLSAn−1 connected to the sense amplifiers SA0, SA1, . . . , SAn−1 in the sense amplifier section during the same time period substantially.

AS the separation control means, the separating transistors QST0, QST1, . . . , QSTn−1 and /QST0, /QST1, . . . , /QSTn−1 as well as the separation-control-signal generating circuit 11 function to render the time periods to write data to memory cells same substantially.

As a result, the semiconductor memory device according to the present embodiment is capable of writing the data representing "0 (zero)" or "1" to the memory cells, which "0 (zero)" or "1" should be written, during the same time period substantially. In addition, the semiconductor memory device according to the present embodiment is capable of avoiding a problem of disturbances by the selected memory cells to the non-selected memory cells.

The present embodiment enables the semiconductor memory device to be used for normal write operations. Furthermore, the present embodiment enables the semiconductor memory to be used to write the data to the memory cells before the semiconductor memory device is left at high temperature for the purpose of testing the data retention capability of the semiconductor memory device. Moreover, the present embodiment enables the semiconductor memory device to be used to write the inverted date to the memory cells. This embodiment enables the semiconductor memory to write the data representing any one of "0 (zero)" and "1" to each of the memory cells 1, ..., 1 almost simultaneously and in almost the same lengths of time.

It should be noted that less than four memory cells or more than four memory cells may be connected to one another in series on each column, although the four memory cells are connected to one another in series in each column in the case of the present embodiment. In addition, though the paired plate lines /PL and PL are used in the present embodiment, the data is capable of being written to, or read from, the memory cells 1, ..., 1 by use of a single plate line instead.

In the case of the present embodiment, the transistors NT1 and NT2 are of n-channel type, whereas the transistor PT1 is of p-channel type. Instead, however, the transistors NT1 and NT2 may be of p-channel type, whereas the transistor PT1 may be of n-channel type, by connecting the source of the transistor PT1 to the low-potential supply voltage Vss, and the source of the transistor NT2 to the high-potential supply voltage Vpp.

Figure 6:
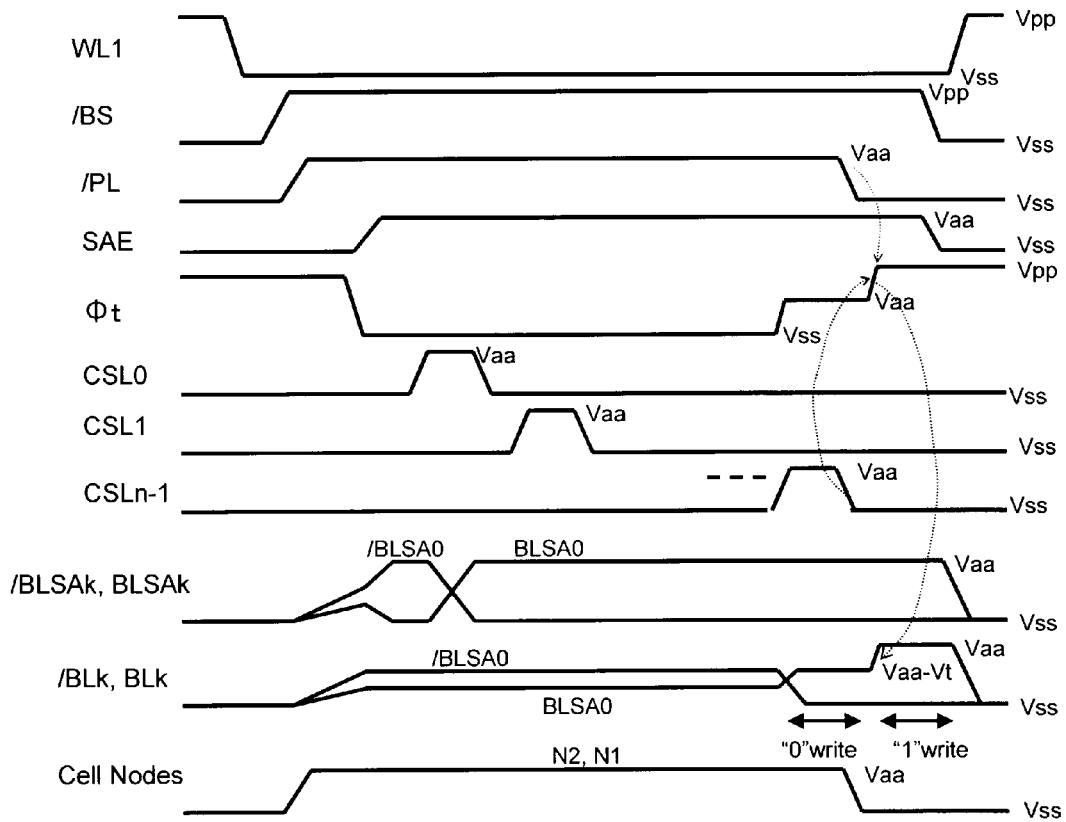
FIG. 6 is a timing chart showing a write operation of a semiconductor memory device according to a second embodiment of the present invention.

A semiconductor memory according to the second embodiment of the invention will be described with reference to FIG. 6. FIG. 6 is a timing chart showing an operation of the semiconductor memory device according to the second embodiment. Because the semiconductor memory device according to the second embodiment uses the same circuit as the semiconductor memory device 30 according to the first embodiment, the configuration shown in FIG. 1 will be also referred to while the second embodiment is explained.

Like the semiconductor memory device according to the first embodiment, the semiconductor memory device according to the second embodiment makes a control in order that a time periods to write data to memory cells are almost same. In addition, the second embodiment enables data to be written to all the columns in a shorter cycle than the first embodiment.

As shown in FIG. 6, for example, when the word line WL1 is selected, the voltage of the word line WL1 is changed from the "High" level ("Vpp" level) to the "Low" level ("Vss" level). The voltage of the bit-line selecting signal /BS is changed from the "Low" level ("Vss" level) to the "High" level ("Vpp" level). With the voltage of the word line WL1 and the voltage of the bit-line selecting signal kept respectively in these states, the voltage of the plate line /PL is changed from the "Low" level ("Vss" level) as the first voltage level to the "High" level ("Vaa" level) as the second voltage level. Subsequently, the voltages respectively of the column selecting signals CSL0, ..., CSLn−1 are changed from the "Low" level ("Vss" level) to the "High" level ("Vpp" level).

As a result of these operations, data held in each of the memory cells connected to the word line WL1 is read out to a correspond one of the bit lines /BL0, /BL1, ..., BLn−1.

Once the voltage of the column selecting signal CSLn−1 selected at last is changed from the "Low" level ("Vss" level) to the "High" level ("Vpp" level), the data is read from the bit line BLSAn−1 located in the lowermost column in the sense amplifier section.

In the case of the present embodiment, particularly simultaneously to this change in voltage level, the voltage of the separation control signal Φt is raised from the "Low" level ("Vss" level) as the fourth voltage level to the "Vaa" level as the fifth voltage level lower than the "Vpp" level. As a result, the data "0 (zero)" is quickly and almost simultaneously written to all of the memory cells to which the data "0 (zero)" should be written.

Thereafter, the voltage of the plate line /PL is changed from the "High" level ("Vaa" level) as the second voltage level to the "Low" level ("Vss" level) as the first voltage level. After the voltage of the column selecting signal CSLn−1 is changed to the "Low" level, the voltage of the separation control signal φt is raised from the "Vaa" level as the fifth voltage level to the "High" level ("Vpp" level) as the third voltage level. As a result, the data "1" is almost simultaneously written to all of the memory cells to which the data "1" should be written.

In the semiconductor memory device according to the second embodiment, the separating transistors QST0, QST1, ..., QSTn−1 and /QST0, /QST1, ..., /QSTn−1 as well as the separation-control-signal generating circuit 11 for supplying the separation control signal Φt to these separation transistors are used as the separation control means. This use enables the time period to write the data to a memory cell to be almost as long as the time spent to write the data to any other memory cell. Furthermore, when the voltage of the column selecting signal CSLn−1 selected at last is changed from the "Low" level to the "High" level so that the column selecting transistor is turned on, the voltage of the separation control signal Φt is raised to the "Vaa" level.

As a result, the semiconductor memory device according to the second embodiment may have the same advantages as the semiconductor memory device according to the first embodiment. The semiconductor memory device according to the second embodiment may further have the advantage that the data write operation is performed faster than that of the semiconductor memory according to the first embodiment.

Figure 7:
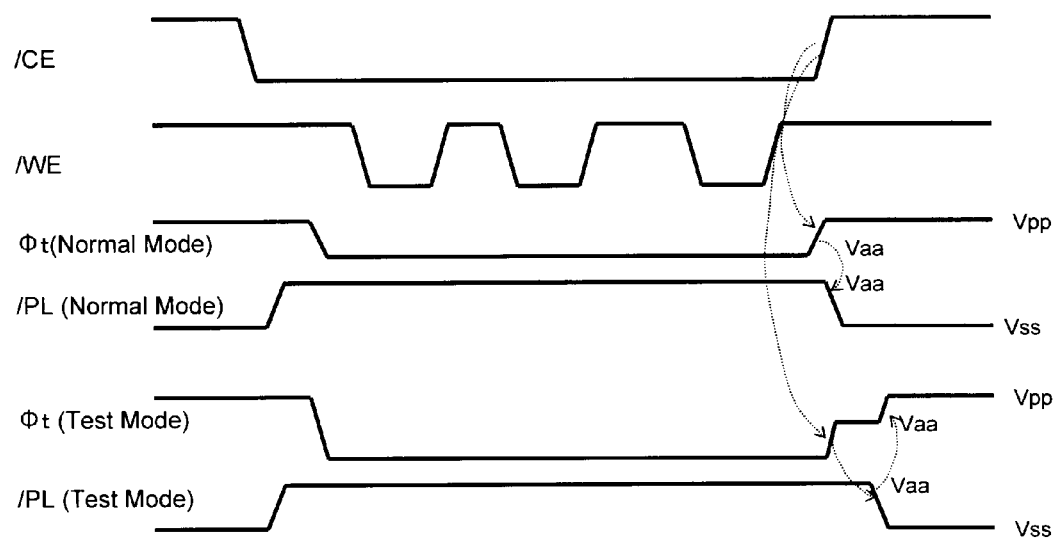
FIG. 7 is a timing chart showing a write operation of a semiconductor memory device according to a third embodiment of the present invention.

A semiconductor memory device according to a third embodiment of the invention will be described with reference to FIG. 7. FIG. 7 is a timing chart showing an operation of the semiconductor memory device according to the third embodiment.

Because the semiconductor memory device according to the third embodiment includes the same circuit configuration as the semiconductor memory device 30 according to the first embodiment, the configuration shown in FIG. 1 will be also referred to while the third embodiment is described. The semiconductor memory device according to the present embodiment makes a control in order that the time period to write data to each of the column can be same substantially in the normal mode and the test mode.

As shown in FIG. 7, the voltage of a chip enable signal /CE is changed from the "High" level to the "Low" level, and subsequently to the "High" level. The voltage of the plate line /PL (not shown) is changed from the "Low" level ("Vss" level) as the first voltage level to the "High" level ("Vaa"

level) as the second voltage level, and subsequently to the "Low" level ("Vss" level) as the first voltage level.

While the semiconductor memory device is in the normal mode, the voltage of the chip enable signal /CE is changed from the "High" level to the "Low" level, and subsequently the voltage of the plate line /PL is changed from the "Low" level to the "High" level. Thereafter, the voltage of the separation control signal Φt is dropped from the "High" level ("Vpp" level) as the third voltage level to the "Vaa" level as the fifth voltage level. After that, the voltage of the write enable signal /WE is sequentially changed to the "High" level. Thereby, write data from the outside is written to each corresponding one of the sense amplifiers SA0, SA1, . . . , SAn−1.

Thereafter, the voltage of the chip enable signal /CE is changed from the "Low" level to the "High" level. Thereby, the voltage of the separation control signal Φt is raised from the "Vaa" level as the fifth voltage level to the "High" level ("Vpp" level) as the third voltage level. The voltage of the plate line /PL is dropped from the "High" level ("Vaa" level) as the second voltage level to the "Low" level ("Vss" level) as the first voltage level.

These operations may prevent each of the non-selected memory cells from being electrically disturbed by the data "1" read from a corresponding one of the memory cells 1, . . . , 1, or the data "1" written to each of the sense amplifiers from the outside by changing the voltage of the column selecting signal to the "High" level. Here, the data is amplified by a corresponding one of the sense amplifiers.

In contrast, while the semiconductor memory device is in the test mode, the voltage of the chip enable signal /CE is changed from the "High" level to the "Low" level, and subsequently the voltage of the plate line /PL is changed from the "Low" level to the "High" level. Thereafter, the separation control signal Φt is changed from the "High" level ("Vpp" level) as the third voltage level to the "Vaa" level as the fifth voltage level. After that, the voltages respectively of the write enable signals /WE are sequentially changed to the "High" level, and thus write data from the outside is written to each corresponding one of the sense amplifiers.

Subsequently, the voltage of the chip enable signal /CE is changed from the "Low" level to the "High" level. Thereby, the voltage of the separation control signal Φt is changed from the "Low" level ("Vss" level) as the fourth voltage level to the "Vss" level as the fifth voltage level, and the data "0 (zero)" is written to the memory cells simultaneously. After that, the voltage of the plate line /PL is changed from the "High" level ("Vaa" level) as the second voltage level to the "Low" level ("Vss" level) as the first voltage level. Thereafter, the voltage of the separation control signal Φt is changed from the "Vaa" level as the fifth voltage level to the "High" level ("Vpp" level) as the third voltage level, and the data "1" is written to the memory cells simultaneously.

As described above, the semiconductor memory device according to the present embodiment is capable of writing the data to the memory cells 1, . . . , 1 simultaneously and in almost the same lengths of time both in the normal mode and in the test mode.

The semiconductor memory device according to the present embodiment to render the amount of polarization of each of the memory cells 1, . . . , 1 equal substantially in writing data to the memory cells. In addition, the semiconductor memory device according to the present embodiment is capable of accurately writing data to the memory cells before the semiconductor memory device is kept at high temperature for the purpose of testing the data holding capability of the semiconductor memory device. The semiconductor memory device according to the present embodiment is capable of accurately writing inverted data to the memory cells for the purpose of testing the imprint capability.

Figure 8:
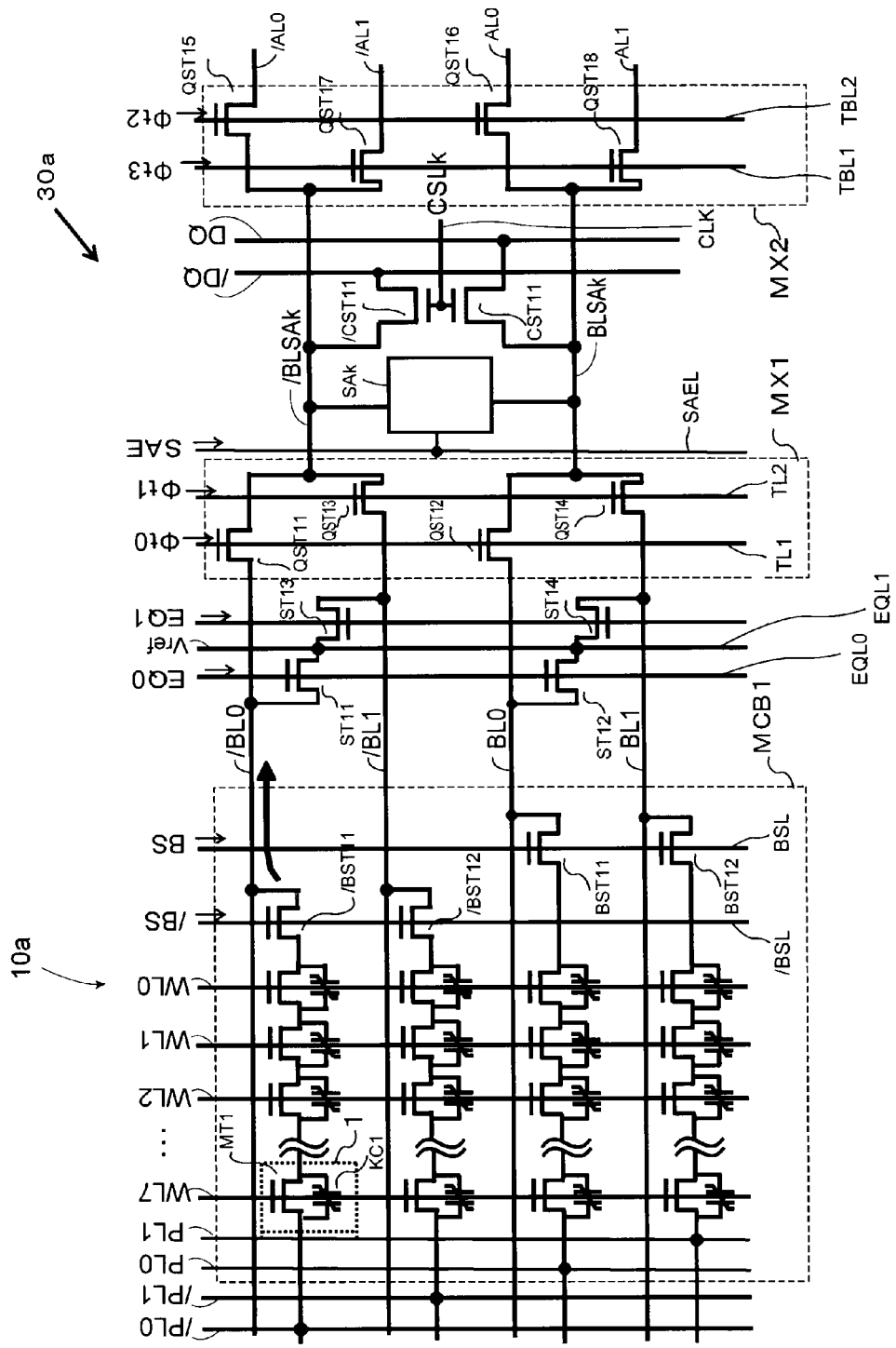
FIG. 8 is a circuit diagram showing a semiconductor memory device according to a fourth embodiment of the present invention.

A semiconductor memory device according to a fourth embodiment of the present invention will be described with reference to FIG. 8. FIG. 8 shows a kth circuit constituting this semiconductor memory device, where k is an arbitrary integer including zero. The other circuits each have the same circuit configuration.

In FIG. 8, components which are the same as those shown in FIG. 1 are denoted by the same reference numerals.

The semiconductor memory device according to the present embodiment makes a control in order that the time periods to write data to any column are almost the same as the semiconductor memory device according to the first embodiment. The semiconductor memory device according to the present embodiment has reduced numbers of sense amplifiers, column selecting transistors and column selecting signal LINES, in comparison with the semiconductor memory according to the first embodiment.

As shown in FIG. 8, the semiconductor memory device 30*a* is provided with a memory cell block MCB1, a kth sense amplifier, multiplexers MX1 and MX2, column selecting transistors /CST11 and CST11 as well as separation transistors ST11 to ST14.

The memory cell block MCB1 is provided with bit-line selecting transistors /BST11, /BST12, BST11 and BST12.

The bit lines /BLSAk and BLSAk in the sense amplifier section, which are the respective second portions of the bit lines, are connected to the sense amplifier SAk. The multiplexer MX2 is connected to the bit lines /BLSAk and BLSAk arranged in the sense amplifier section.

The multiplexer MX1 is composed of separating transistors QST11 to QST14 and other separating transistors (not shown). The multiplexer MX2 is composed of separating transistors QST15 to QST18 and further other separating transistors (not shown). Four separation-control-signal generating circuits (not illustrated), which have the same configuration as the separation-control-signal generating circuit 11 shown in FIG. 2, are connected to the gates of the respective separating transistors QST11 to QST18 via a control lines TL1, TL2, TBL1 and TBL2, for example. The four separation-control-signal generating circuits are also connected to each of the other separating transistors (not shown) via a control line TL1, TL2, TBL1 and TBL2 as the separating transistors QST11 to QST18.

Separation control signals Φt0, Φt1, Φt2 and Φt3 are supplied to the control lines TL1, TL2, TBL1 and TBL2 from the four separation-control-signal generating circuits, respectively. Each of the separation control signals Φt0, Φt1, Φt2 and Φt3 outputs any one of the low-potential supply voltage (ground potential) Vss, the intermediate voltage Vaa and the high-potential supply voltage Vpp.

The gates of the first cell transistors MT1 from the bit-line selecting transistors /BST11, /BST12, BST11 and BST12 in the row direction are connected to the word line WL0, respectively. The gates of the second cell transistors MT1 from the bit-line selecting transistors /BST11, /BST12, BST11 and BST12 in the row direction are connected to the word line WL1, respectively. The gates of the third cell transistors MT1 from the bit-line selecting transistors /BST11, /BST12, BST11 and BST12 in the row direction are connected to the word line WL2, respectively. Similarly, the gates of the 8th cell transistors MT1 from the bit-line selecting transistors /BST11, /BST12, BST11 and BST12 in the row direction are connected to the word line WL7, respectively.

One of the source and drain of the control transistor ST11 is connected to the bit line /BL0. The other of the source and drain of the control transistor ST11 is connected to a reference voltage Vref. The gate of the control transistor ST11 is connected to a control line EQL0. A control signal EQ0 is inputted to the control line EQL0.

One of the source and drain of the control transistor ST13 is connected to the reference voltage Vref. The other of the source and drain of the control transistor ST13 is connected to the bit line /BL1. The gate of the control transistor ST13 is connected to a control line EQL1. A control signal EQ1 is inputted to the control line EQL1.

One of the source and drain of the control transistor ST12 is connected to the bit line BL0. The other of the source and drain of the control transistor ST12 is connected to the reference voltage Vref. The gate of the control transistor ST12 is connected to a control line EQL0. The control signal EQ0 is inputted to the control line EQL0.

One of the source and drain of the control transistor ST14 is connected to the reference voltage Vref. The other of the source and drain of the control transistor ST14 is connected to the bit line BL1. The gate of the control transistor ST14 is connected to the control line EQL1. The control signal EQ1 is inputted to the control line EQL1.

When the voltage of the control signal EQ0 is at the "High" level, the control transistors ST11 and ST12 are turned "ON." When the voltage of the control signal EQ1 is at the "High" level, the control transistors ST13 and ST14 are turned "ON."

The bit lines /BL0 and /BL1 of the multiplexer MX1 are connected to the bit line /BLSAk arranged in the sense amplifier section, whereas the bit lines BL0 and BL1 are connected to the bit line BLSAk arranged in the sense amplifier section.

One of the source and drain of the separating transistor QST11 constituting the multiplexer MX1 is connected to the bit line /BL0. The other of the source and drain of the separating transistor QST11 is connected to the bit line /BLSAk arranged in the sense amplifier section. The gate of the separating transistor QST11 is connected to the control line TL1. In this respect, the separation control signal Φt0 is inputted to the control line TL1. When the voltage of the separating control signal Φt0 is at the "Low" level, the separating transistor QST11 separates the sense amplifier SAk from the memory cells connected to the bit line /BL0.

One of the source and drain of the separating transistor QST13 constituting the multiplexer MX1 is connected to the bit line /BL1. The other of the source and drain of the separating transistor QST13 is connected to the bit line /BLSAk arranged in the sense amplifier section. The gate of the separating transistor QST13 is connected to the control line TL2. In this respect, the separation control signal Φt1 is inputted to the control line TL2. When the voltage of the separation control signal Φt1 is at the "Low" level, the separating transistor QST13 separates the sense amplifier SAk from the memory cells connected to the bit line /BL1.

One of the source and drain of the separating transistor QST12 constituting the multiplexer MX1 is connected to the bit line BL0. The other of the source and drain of the separating transistor QST12 is connected to the bit line BLSAk arranged in the sense amplifier section. The gate of the separating transistor QST12 is connected to the control line TL1. In this respect, the separation control signal Φt0 is inputted to the control line TL1. When the voltage of the separation control signal Φt0 is at the "Low" level, the separating transistor QST12 separates the sense amplifier SAk from the memory cells connected to the bit line BL0.

One of the source and drain of the separating transistor QST14 constituting the multiplexer MX1 is connected to the bit line BL1. The other of the source and drain of the separating transistor QST14 is connected to the bit line BLSAk arranged in the sense amplifier section. The gate of the separating transistor QST14 is connected to the control line TL2. In this respect, the separation control signal Φt1 is inputted to the control line TL2. When the voltage of the separation control signal Φt1 is at the "High" level, the separating transistor QST14 separates the sense amplifier SAk from the memory cells connected to the bit line BL1.

One end of the sense amplifier SAk is connected to the bit line /BLSAk arranged in the sense amplifier section. The other end of the sense amplifier SAk is connected to bit line BLSAk arranged in the sense amplifier section. The gate of the sense amplifier SAk is connected to a sense-amplifier activating line SAEL. A sense-amplifier activating signal SAE is inputted to the sense-amplifier activating line SAEL, and thereby the sense amplifier SAk is controlled.

One of the source and drain of the column selecting transistor /CST11 is connected to a data line /DQ. The other of the source and drain of the column selecting transistor /CST11 is connected to the bit line /BLSAk arranged in the sense amplifier section. The gate of the column selecting transistor /CST11 is connected to a column selecting line CLk.

One of the source and drain of the column selecting transistor CST11 is connected to a data line DQ. The other of the source and drain of the column selecting transistor CST11 is connected to the bit line BLSAk arranged in the sense amplifier section. The gate of the column selecting transistor CST11 is connected to a column selecting line CLk.

A column selecting signal CSLk is inputted to the column selecting line CLk.

One of the source and drain of the separating transistor QST15 constituting the multiplexer MX2 is connected to the bit line /BLSAk arranged in the sense amplifier section. The other of the source and drain of the separating transistor QST15 is connected to a bit line /AL0. The gate of the separating transistor QST15 is connected to the control line TBL2. The separation control signal Φt2 is inputted to the control line TBL2. When the voltage of this separation control signal Φt2 is at the "Low" level, the separating transistor QST15 separates the sense amplifier SAk from the memory cells (not illustrated) connected to the bit line AL0.

One of the source and drain of the separating transistor QST17 constituting the multiplexer MX2 is connected to the bit line /BLSAk1 in the sense amplifier section. The other of the source and drain of the separating transistor QST17 is connected to a bit line /AL1. The gate of the separating transistor QST17 is connected to the control line TBL1. The separation control signal Φt3 is inputted to the control line TBL1. When the voltage of the separation control signal Φt3 is at the "Low" level, the separation transistor QST17 separates the sense amplifier SAk from the memory cells (not illustrated) connected to the bit line AL1.

One of the source and drain of the separating transistor QST16 constituting the multiplexer MX2 is connected to the bit line BLSAk1 in the sense amplifier section. The other of the source and drain of the separating transistor QST16 is connected to a bit line AL0. The gate of the separating transistor QST16 is connected to the control line TBL2. The separation control signal Φt2 is inputted to the control line TBL2. When the voltage of this separation control signal Φt2 is at the "Low" level, the separation transistor QST16 separates the sense amplifier SAk from the memory cells (not illustrated) connected to the bit line AL0.

One of the source and drain of the separating transistor QST18 constituting the multiplexer MX2 is connected to the bit line BLSAk1 in the sense amplifier section. The other of the source and drain of the separating transistor QST18 is connected to a bit line AL1. The gate of the separating transistor QST18 is connected to the control line TBL1. The separation control signal $\Phi t3$ is inputted to the control line TBL1. When the voltage of the separation control signal $\Phi t3$ is at the "Low" level, the separation transistor QST18 separates the sense amplifier SAk from the memory cells (not illustrated) connected to the bit line AL1.

The four separation-control-signal generating circuits connected to the respective control lines TL1, TL2, TBL1 and TBL2 as well as the separating transistors QST11 to QST18, the separation control signals $\Phi t0$ to $\Phi t3$ and the sense-amplifier activating signal SAE function as the separation control means for separating the memory cells from the sense amplifiers SAk.

An operation of the semiconductor memory 30a will be described with reference to FIGS. 8 and 9. FIG. 8 is a timing chart showing the operation of the semiconductor memory 30a.

In FIG. 8, four bit lines /BL0, /BL1, BL0 and BL1 are shown representatively. Two of the bit lines are to function as return bit lines. To describe in more detail, the bit lines /BL0 and BL0, for example, are the return bit lines. The bit line /BL0 is to function as a bit line for reading and writing data, while the bit line BL0 is to function as a reference bit line. These functions of the four bit lines /BL0, /BL1, BL0 and BL1 are to be changed.

In addition, the control transistors ST11 and ST12 are turned to the "OFF" state when the control signal EQ0 at the "Low" level is imparted to the gates of the respective control transistors ST11 and ST12. The control transistors ST13 and ST14 are turned to the "ON" state, when the control signal EQ1 at the "High" level is imparted to the gates of the respective control transistors ST13 and ST14. As a result, the two bit lines /BL1 and BL1 function as shield lines.

Figure 9:
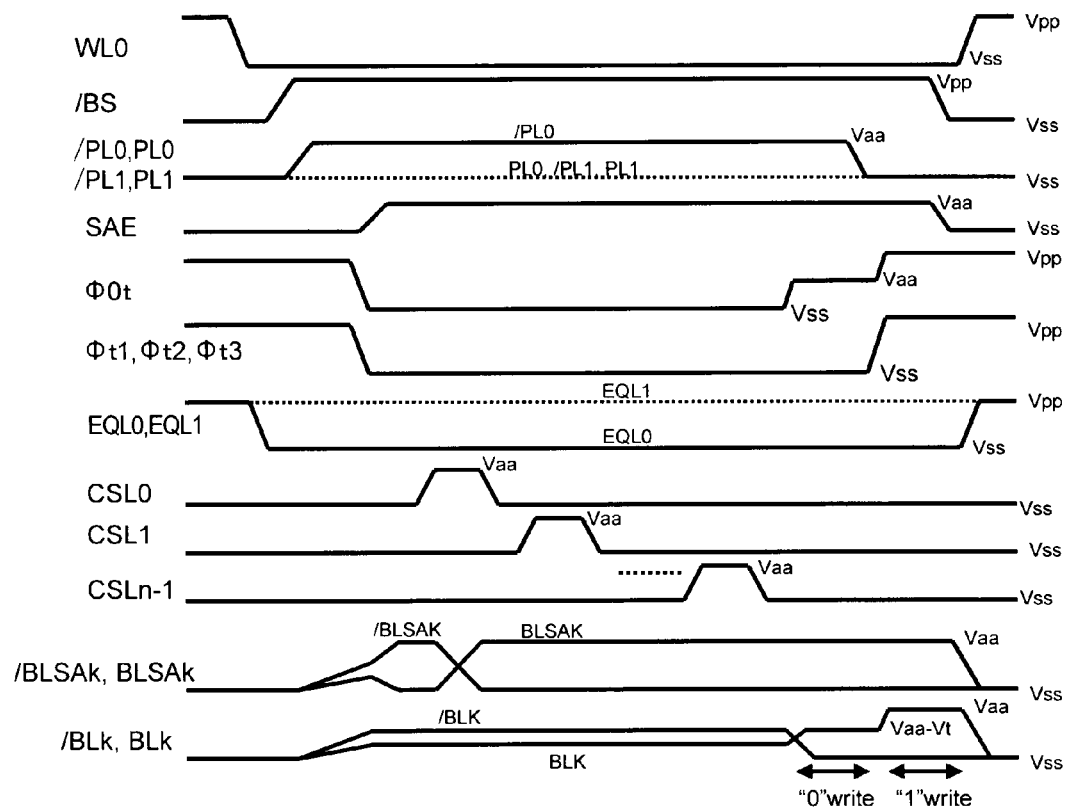
FIG. 9 is a timing chart showing a write operation of a semiconductor memory device according to the fourth embodiment of the present invention.

As shown in FIG. 9, when the voltage of the separation control signal $\Phi t0$ is at the "High" level ("Vaa" level), the voltage of the separation control signal $\Phi t1$ is at the "Low" level ("Vss" level). Similarly, the voltages if the respective separation control signals $\Phi t2$ and $\Phi t3$ are at the "Low" level ("Vss" level). As a result, the separating transistors QST11 and QST12 are turned "ON," and the other separating transistors QST13 to QST18 are turned "OFF." The bit-line selecting transistors /BST11 and /BST12 are turned "ON," and the bit-line selecting transistors BST11 and BST12 are turned OFF.

The voltage of the plate line /PL0 in the timing chart according to the present embodiment, which is shown in FIG. 9, changes in the same manner as the voltage of the plate line /PL in the timing chart according to the first embodiment, which is shown in FIG. 3. The voltage of the plate line /PL0 changes differently from the voltages respectively of the other plate lines /PL1, PL0 and PL1. The voltage of the separation control signal $\Phi t0$ changes in the same manner as the voltage of the separation control signal $\Phi t$ in the timing chart according to the first embodiment, which is shown in FIG. 3. The voltage of the separation control signal $\Phi t0$ changes differently from the voltages respectively of the other separation control signals $\Phi t1$, $\Phi t2$ and $\Phi t3$.

The voltages respectively of the sense-amplifier activating signal SAE, the column selecting signals CSL0, ..., CSLn−1, the bit lines /BLSAk and BLSAk, and the bit lines /BLk and BLk in the timing chart according to the present embodiment, which is shown in FIG. 9, change in the same manner as the voltages respective of those in the timing chart according to the first embodiment, which is shown in FIG. 3.

When, for example, the bit-line selecting transistor /BST11 is turned ON, data stored in each of the memory cells is read to the bit line /BLSAk arranged in the sense amplifier section via the corresponding bit line /BL0. The reference voltage is imparted to the bit line BL0. Subsequently, this voltage is imparted to the bit line BLSAk arranged in the sense amplifier section.

When a column selecting signal CSLk is supplied to the gates respectively of the column selecting transistors /CST11 and CST11, the data is amplified by the sense amplifier SAk, and the data thus amplified is read via the data lines /DQ and DQ.

On the other hand, data is written from the outside as follows.

When the column selecting signal CSLk is supplied to the gates of the respective column selecting transistors /CST11 and CST11, data is written to the bit lines /BLSAk and BLSAk arranged in the sense amplifier section from the outside. The data written to the bit lines /BLSAk and BLSAk arranged in the sense amplifier section is subsequently written to, and retained in, the sense amplifier.

In this case, the separating transistors QST11 to QST18 and the separation-control-signal generating circuit function as the means for controlling the separation of the memory cells 1, ..., 1 from the sense amplifier SAk. When the separation transistors QST11 to QST18 are turned ON by use of the separation control signal $\Phi t0$, it is possible to make the time spent to write the data stored in the sense amplifier SAk to any one of the memory cells equal to the time spent to write the data stored in the same amplifier SAk to any other memory cell.

As described above, the semiconductor memory device according to the present embodiment is capable of writing the data to the memory cells during the same time period substantially as the semiconductor memory device according to the first embodiment. Accordingly, the semiconductor memory device according to the present embodiment is capable of making the polarization amounts equal to one another substantially.

Moreover, the semiconductor memory device according to the present embodiment is capable of writing the data to the memory cells by use of the one sense amplifier SAk and the two column selecting transistors /CST11 and CST11 for the 8 bit lines/BL0, /BL1, BL0, BL1, /AL0, /AL1, AL0 and AL1, for example. For this reason, the semiconductor memory according to the present embodiment has the smaller numbers of sense amplifiers, column selecting transistors and the like as well as the simpler circuit configuration than the semiconductor memory according to the first embodiment.

Figure 10:
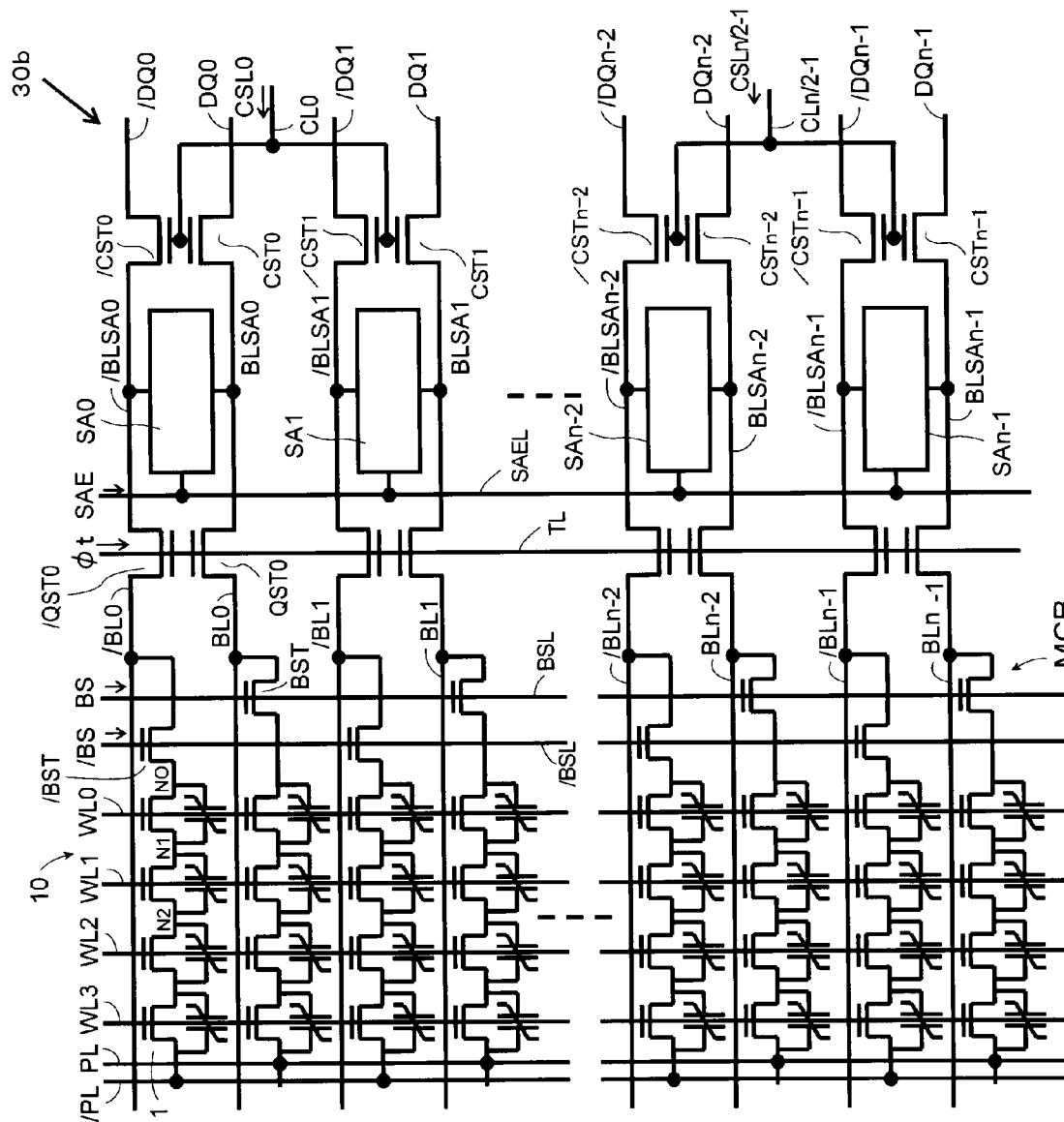
FIG. 10 is a circuit diagram showing a semiconductor memory device according to a fifth embodiment of the present invention.

A semiconductor memory device according to a fifth embodiment of the present invention will be described with reference to FIG. 10. FIG. 10 is a diagram showing a circuit of the semiconductor memory device according to the fifth embodiment. In FIG. 10, components which are the same as those shown in FIG. 1 are denoted by the same reference numerals.

The semiconductor memory includes column selecting lines according to the present embodiment. The number n of the column selecting lines is even. The present embodiment is capable of reducing the number of column selecting lines of the semiconductor memory to the half of that of the semiconductor memory according to the first embodiment.

As shown in FIG. 10, one of each pair of input and output terminals of the sense amplifier SA0 to SAn−1 is connected to each of bit lines /BLSA0 to /BLSAn−1 arranged in the sense amplifier section. The other of each pair of input and output terminals of the sense amplifiers SA0 to SAn−1 is connected to each of bit lines BLSA0 to BLSAn−1. The sense amplifiers SA0 to SAn−1 are controlled by a sense-amplifier activating signal SAE.

One of the source and drain of each of column selecting transistors /CST0, CST0, . . . , /CSTn−1, CSTn−1 is connected to a bit line /BLSA0 arranged in the sense amplifier section. The other of the source and drain of each of the column selecting transistors /CST0, CST0, . . . , /CSTn−1, CSTn−1 is connected to each of the data lines /DQ0, DQ0, . . . , /DQn−1, DQn−1.

The gates of the column selecting transistors /CST0, CST0, /CST1 and CST1 are connected commonly to a column selecting line CL0, to which a column selecting signal CSL0 is inputted. Similarly, the gates of the column selecting transistors /CSTn−2, CSTn−2, /CSTn−1 and CSTn−1 are connected commonly to a column selecting line CLn/2−1, to which a column selecting signal CSLn/2−1 is inputted.

The number of column selecting signals CSL0, . . . , CSLn/2−1 in the present embodiment is a half of the number of column selecting signals in the first embodiment. Voltages respectively of the word lines WL0, . . . , the bit-line selecting signals /BS and BS in the bit-line selecting lines /BSL and BSL, the plate lines /PL and PL, the separation control signal Φt, the sense-amplifier activating signal SAE, the signals in the bit lines /BLSAk and BLSAk arranged in the sense amplifier section, and the signals in the bit lines /BLk and BLk change basically as shown in the timing chart according to the first embodiment, which is illustrated in FIG. 3.

As a result, the present embodiment also renders the semiconductor memory device to perform the same write operation as the semiconductor memory device according to the first embodiment. When, for example, the column selecting signal CSL0 is supplied to the gates of the column selecting transistors /CST0 and CST0, data is written to the bit lines /BLSA0 and BLSA0 in the sense amplifier section through the data lines /DQ0, DQ0 from the outside. The data written to the bit lines /BLSA0 and BLSA0 in the sense amplifier section is written to, and held in, the sense amplifier SA0.

In this case, the separating transistors /QST0 and QST0 as well as a separation-control-signal generating circuit 11 for supplying the separation control signal Φt function as means for controlling the separation of the memory cells from the sense amplifier SA0. The semiconductor memory device according to the present embodiment is capable of writing the data retained in the sense amplifier to the memory cells during the same time period substantially. In addition, the semiconductor memory is capable of writing the data from the outside to the paired /BL0 and Bl0 and the paired /BL1 and BL1. This is the case with any other column selecting signal CSLk, too.

In addition, the present embodiment is capable of reducing the number of column selecting lines in the semiconductor memory to a half of the number of column selecting lines in the semiconductor memory according to the first embodiment. The present embodiment makes the semiconductor memory meet the requirement that data is written to the memory cells from the outside when the semiconductor memory is in the test mode.

Figure 11:
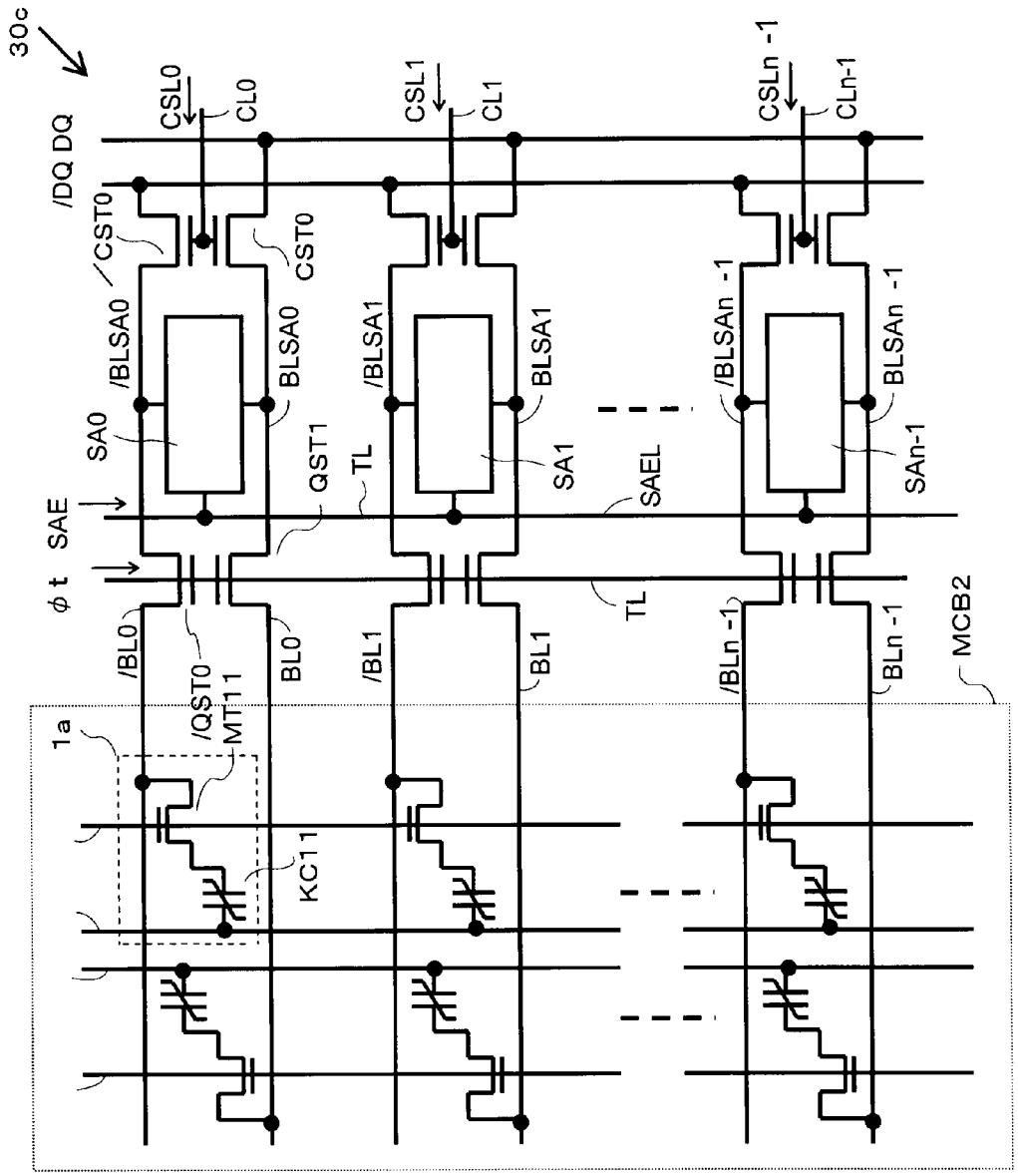
FIG. 11 is a circuit diagram showing a semiconductor memory device according to a sixth embodiment of the present invention.

A semiconductor memory device according to a sixth embodiment of the present invention will be described with reference to FIG. 11. FIG. 11 is a circuit diagram showing the semiconductor memory device according to the 6th embodiment. This semiconductor memory device is 1T1C FeRAM. In FIG. 11, components which are the same as those shown in FIG. 1 are denoted by the same reference numerals.

In the case of the present embodiment, each of memory cells is composed of a corresponding one of multiple ferroelectric capacitors and a corresponding one of multiple insulated-gate-type cell transistors. In each memory cell, the ferroelectric capacitor and the cell transistor are connected to each other in series.

As shown in FIG. 11, the semiconductor memory device 30c includes a memory cell block MCB2. In the memory cell block, a ferroelectric capacitor KC11 and a cell transistor MT11 are connected to each other in series between a bit line /BL0 and a plate line /PL, between a bit line BL0 and a plate line PL, between a bit line /BL1 and the plate line /PL, between a bit line BL1 and the plate line PL, . . . , between a bit line /BLn−1 and the plate line /PL, and between a bit line Bn−1 and the plate line PL. Each of the memory cells 1a is constituted of one ferroelectric capacitor KC11 and one cell transistor MT11 connected to each other in series. The memory cells 1a, . . . , 1a are arranged in a matrix.

Specifically, one of the source and drain of a cell transistor MT11 arranged in the uppermost row is connected to the bit line /BL0. The other of the source and drain of the cell transistor MT11 is connected to one end of the ferroelectric capacitor KC11. The gate of the cell transistor MT11 is connected to a word line 1. The other end of the ferroelectric capacitor KC11 is connected to the plate line /PL.

A separation-control-signal generating circuit (not illustrated) for supplying a separation control signal Φt, which is similar to the separation-control-signal generating circuit shown in FIG. 2A, is connected to the separating transistors /QST0, QST0, . . . .

As will be described below, the separating transistors /QST0, QST0, . . . and the separation control signal work as separation control means, and function in order that data can be written to the memory cells 1a, . . . , 1a during the same time period substantially.

Figure 12:
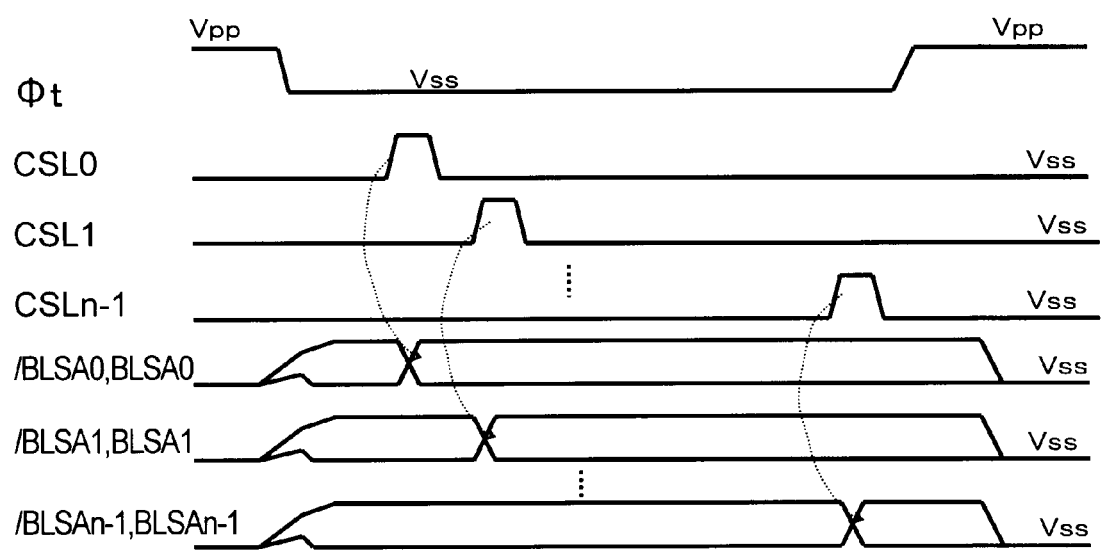
FIG. 12 is a timing chart showing a write operation of the semiconductor memory device according to the sixth embodiment of the present invention.

An operation of the semiconductor memory device according to the sixth embodiment of the invention will be described with reference to FIG. 12. FIG. 12 is a timing chart showing an operation of the semiconductor memory device according to the sixth embodiment operates.

In the semiconductor memory device 30c, the voltage of the plate line /PL is changed from the "Low" level ("Vss" level) to the "High" level ("Vpp" level). Thereby, data from each of the memory cells is written to a corresponding one of the bit lines /BL0, BL0, /BL1, BL1, . . . , /BLn−1 and BLn−1. Subsequently, as shown in FIG. 12, the data is written further to a corresponding one of bit lines /BLSA0, BLSA0, /BLSA1, BLSA1, . . . , /BLSAn−1, BLSAn−1. As a result, the data is amplified by each of the sense amplifiers SA0, . . . , SAn−1.

Thereafter, as shown in FIG. 12, the voltage of the separation control signal Φt is changed from the "High" level ("Vpp" level) to the "Low" level ("Vss" level). Subsequently, the column selecting signals CSL0, CSL1, . . . , CSLn−1 sequentially rise. Thereby, the column selecting transistors /CST0, CST0, . . . are turned ON. By this, data from the outside is written to the sense amplifiers SA0, . . . , SAn−1 via data line /DQ and DQ, and subsequently via the bit lines /BLSA0, BLSA0, /BLSA1, BLSA1, . . . , /BLSAn−1, BLSAn−1. At this time, data retained in each of the sense amplifiers SA0, . . . , SAn−1 is not yet written to the memory cells 1, . . . , 1.

Subsequently, the voltage of the separation signal Φt is changed from the "Low" level ("Vss" level) to the "High" level ("Vpp" level). Thereby, data "0 (zero)" is sequentially written from the sense amplifiers SA0, . . . , SAn−1 to memory cells to which the data "0 (zero)" should be written almost simultaneously.

Thereafter, the voltage of the plate line /PL is changed from the "High" level to the "Low" level. Thereby, data "1" is written to memory cells to which the data "1" should be written almost simultaneously.

As described above, the voltage of the separation control signal Φt is changed from the "High" level to the "Low" level, and subsequently to the "High" level. This makes the semiconductor memory device capable of writing the data to the memory cells in almost the same lengths of time before the semiconductor memory device is kept at high temperature for the purpose of testing its data retention capability. In addition, the semiconductor memory device is capable of writing the inverted data to the memory cells for the purpose of testing its imprint capability. In this case, the selected memory cells are prevented to disturb the non-selected memory cells.

The separation control signal Φt may be used in the normal mode. In this case, the voltage of the separation control signal Φt may always remain at the "High" level without dropping to the "Low" level.

Unlike the voltage of the separation control signal Φt according to the first embodiment, the voltage of the separation control signal Φt according to the present embodiment is at any one of the two voltage levels, i.e. the low-potential supply voltage Vss (ground potential) and the high-potential supply voltage Vpp.

This separation control voltage Φt works to separate the bit lines /BL0, BL0, /BL1, BL1, . . . , /BLn−1, BLn−1 connected to the memory cells from the bit lines /BLSA0, BLSA0, /BLSA1, BLSA1, . . . , /BSALn−1, BSALn−1 connected to the sense amplifiers SA0, SA1, . . . , SAn−1 in the sense amplifier section. Thereby, the data "0 (zero)" and the data "1" from the outside are written to their corresponding memory cells almost simultaneously.

The sixth embodiment has been described citing the example of an 1T1C type FeRAM. However, the present invention is applicable to a 2T2C type FeRAM.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor memory device comprising:
at least one plate line;
bit lines, each of the bit lines having a first portion and a second portion;
memory cells, each of the memory cells being coupled between one of the first portions of the bit lines and the at least one plate line, each of the memory cells including a ferroelectric capacitor and a cell transistor;
word lines, each of the word lines being connected to ones of the gates of the cell transistors;
sense amplifiers to amplify and hold data, each of the sense amplifiers being connected to at least one of the second portions of the bit lines;
bit-line selecting transistors, each of the bit-line selecting transistors being connected between one of the memory cells and one of the first portions of the bit lines; and
separating transistors, each of the separating transistors having a source, a drain, and a gate, one of the source and the drain being connected to the first portion of a corresponding one of the bit lines, the other of the source and the drain being connected to the second portion of the corresponding one of the bit lines, and the gate being connected to a separation control line to provide a separation control signal, wherein the semiconductor memory device performs
dropping a voltage of the separation control signal from a third voltage to a fourth voltage, after a voltage of the at least one plate line rises from a first voltage to a second voltage;
subsequently, raising the voltage of the separation control signal from the fourth voltage to a fifth voltage lower than the third voltage;
dropping the voltage of the at least one plate line from the second voltage to the first voltage, after the rise of the voltage of the separation control signal from the fourth voltage to the fifth voltage; and
subsequently, raising the voltage of the separation control signal from the fifth voltage to the third voltage.

2. The semiconductor memory device as recited in claim 1, wherein the fourth voltage is a ground potential.

3. The semiconductor memory device as recited in claim 1, wherein the fourth voltage is set at a level equal to that of the fifth voltage in a normal operation mode of the semiconductor memory.

4. The semiconductor memory device as recited in claim 1, further comprising:
a plurality of column selecting transistors, each of the column selecting transistors being connected to one of the second portions of the bit lines; and
column selecting lines connected to the column selecting transistors,
wherein write data received is written to the sense amplifiers via the second portions of the bit lines when the column selecting transistors are turned on, and subsequently, the voltage of the separation control signal is raised from the fourth voltage to the fifth voltage after the column selecting transistors are turned off.

5. The semiconductor memory device as recited in claim 1, further comprising a separation-control-signal generating circuit connected to the separation control line, the separation-control-signal generating circuit including:
a first transistor of one conductive channel, one of the drain and source of the first transistor of the one conductive channel being provided with the fifth voltage, the other of the drain and source of the first transistor of the one conductive channel being connected to an output terminal, and a gate of the first transistor of the one conductive channel being provided with a first control signal;
a first transistor of an opposite conductive channel, one of the source and drain of the first transistor of the opposite conductive channel being provided with the third voltage, the other of the source and drain of the first transistor of the opposite conductive channel being connected to the output terminal, a gate of the first transistor of the opposite conductive channel being provided with a second control signal;
a second transistor of the one conductive channel, one of the drain and source of the second transistor of the one conductive channel being connected the output terminal, the other of the drain and source of the second transistor of the one conductive channel being connected to a ground potential, and a gate of the second transistor of the one conductive channel being provided with a third control signal.

6. The semiconductor memory device as recited in claim 1, wherein, when the voltage of the separation control signal is raised from the fourth voltage to the fifth voltage, data zero is written to the memory cells during the same time period substantially, to which the data zero should be written, and, when the voltage of the separation control signal is raised from the fifth voltage to the third voltage, data one is written to the plurality of memory cells during the same time period substantially, to which the data one should be written.

7. The semiconductor memory device as recited in claim 4, wherein data is written to each of the sense amplifiers via a pair of the column selecting transistors.

8. The semiconductor memory device as recited in claim 7, further comprising control transistors connected between the separation transistors and the bit-line selecting transistors, wherein the bit lines are used as sealed bit lines, reference bit lines, or data write bit lines by switching the control transistors.

9. The semiconductor memory device as recited in claim 4, wherein each of the column selecting lines is connected to a pair of two of the column selecting transistors connected respectively to each two of the sense amplifiers.

10. The semiconductor memory device as recited in claim 1, wherein each of the ferroelectric capacitors and each of the cell transistors are connected to each other in parallel in each of the memory cells.

11. The semiconductor memory device as recited in claim 10, wherein ones of the memory cells are connected in series with a one of the bit-line selecting transistors.

12. The semiconductor memory device as recited in claim 2, wherein the third voltage is to be applied to the at least one plate line.

13. The semiconductor memory device as recited in claim 1, wherein the separating transistors are turned on by supplying a separation control signal to the separation control line so that data held in the sense amplifiers is written to the memory cells during the same time period substantially, in a test mode.

14. The semiconductor memory device as recited in claim 4, wherein write data received is written to the sense amplifiers, and, concurrently, the voltage of the separation control signal is raised from the fourth voltage to the fifth voltage, when the column selecting transistors are turned on.

* * * * *